US011452228B2

(12) United States Patent
Ogane et al.

(10) Patent No.: US 11,452,228 B2
(45) Date of Patent: Sep. 20, 2022

(54) DRIVER

(71) Applicant: MITSUBA Corporation, Gunma (JP)

(72) Inventors: Takahiko Ogane, Gunma (JP);
Fumiaki Koshio, Gunma (JP);
Hiroyuki Hirano, Gunma (JP);
Hirokazu Takada, Gunma (JP)

(73) Assignee: MITSUBA Corporation, Gunma (JP)

( * ) Notice: Subject to any disclaimer, the term of this patent is extended or adjusted under 35 U.S.C. 154(b) by 14 days.

(21) Appl. No.: 17/277,292

(22) PCT Filed: Feb. 13, 2020

(86) PCT No.: PCT/JP2020/005529
§ 371 (c)(1),
(2) Date: Mar. 17, 2021

(87) PCT Pub. No.: WO2021/059549
PCT Pub. Date: Apr. 1, 2021

(65) Prior Publication Data
US 2021/0392772 A1 Dec. 16, 2021

(30) Foreign Application Priority Data
Sep. 25, 2019 (JP) .............................. JP2019-174115

(51) Int. Cl.
*H05K 7/14* (2006.01)
*H02K 11/33* (2016.01)
(52) U.S. Cl.
CPC ........... *H05K 7/1432* (2013.01); *H02K 11/33* (2016.01)

(58) Field of Classification Search
CPC ........... H01L 23/3135; H01L 2924/181; H01L 21/56; H01L 21/565; H01L 21/563; H02K 11/33; H05K 7/1432
USPC ........................................................ 257/772
See application file for complete search history.

(56) References Cited

U.S. PATENT DOCUMENTS 5,165,956 A * 11/1992 Wong .................. H01L 23/3142
427/407.1
5,317,196 A * 5/1994 Wong ...................... H01L 23/22
257/E23.189
5,336,931 A * 8/1994 Juskey ................ H01L 23/3121
257/E23.125

(Continued)

FOREIGN PATENT DOCUMENTS

JP       S58063757       4/1983
JP       S59031044       2/1984
(Continued)

OTHER PUBLICATIONS

"International Preliminary Report on Patentability (Form PCT/IPEA/409) of PCT/JP2020/005529," completed on Jul. 21, 2020, with English translation thereof, pp. 1-6.

*Primary Examiner* — Krystal Robinson
(74) *Attorney, Agent, or Firm* — JCIPRNET

(57) ABSTRACT

A driver is provided. A driver (1) includes an aluminum substrate (10) to which electronic components (13) are joined, and a resin member (20) that covers the electronic components (13). The resin member (20) has a first resin portion (21) that covers the electronic components (13) and a second resin portion (22) that covers the first resin portion (21). The hardness of the first resin portion (21) is lower than the hardness of the second resin portion (22).

17 Claims, 6 Drawing Sheets

(56) References Cited

U.S. PATENT DOCUMENTS

| | | | | | |
|---|---|---|---|---|---|
| 5,386,342 | A | * | 1/1995 | Rostoker | H01L 23/564 |
| | | | | | 257/668 |
| 5,700,981 | A | * | 12/1997 | Tuttle | H01L 23/3135 |
| | | | | | 29/841 |
| 2007/0246833 | A1 | * | 10/2007 | Soga | H01L 23/24 |
| | | | | | 257/772 |
| 2013/0119528 | A1 | * | 5/2013 | Groothuis | H01L 25/0657 |
| | | | | | 257/777 |
| 2014/0233188 | A1 | * | 8/2014 | Terasawa | H05K 7/142 |
| | | | | | 361/748 |
| 2018/0247915 | A1 | * | 8/2018 | Kinsley | H01L 25/0657 |
| 2021/0159189 | A1 | * | 5/2021 | Yu | H01L 21/32051 |
| 2021/0193543 | A1 | * | 6/2021 | Liu | H01L 21/56 |

FOREIGN PATENT DOCUMENTS

| | | |
|---|---|---|
| JP | S59042043 | 3/1984 |
| JP | H08204065 | 8/1996 |
| JP | H09153590 | 6/1997 |
| JP | 2008192742 | 8/2008 |
| JP | 2015218650 | 12/2015 |
| WO | 2019038906 | 2/2019 |

\* cited by examiner

DRIVER

CROSS-REFERENCE TO RELATED APPLICATION

This application is a 371 application of the International PCT application serial no. PCT/JP2020/005529, filed on Feb. 13, 2020, which claims the priority benefits of Japan Patent Application No. 2019-174115, filed on Sep. 25, 2019. The entirety of each of the above-mentioned patent applications is hereby incorporated by reference herein and made a part of this specification.

BACKGROUND

Technical Field

The present invention relates to a driver.

Related Art

A driver that controls a motor mounted on a vehicle has, for example, a control board on which a switching element and an integrated circuit (IC) element are mounted. Examples of such a drive include a driver in which a filler is filled in a storage recess portion of a case of the driver after the control board is attached. The control board is sealed in the case of the driver by the filler.

LITERATURE OF RELATED ART

Patent Literature

Patent literature 1: Japanese Patent Laid-open No. 2015-218650

SUMMARY

Problems to be Solved

In the above-mentioned driver of prior art, the filler is cured while covering electronic components mounted on the control board, such as switching elements, IC elements, and wirings.

However, in the above driver, a stress caused by expansion or contraction of the filler due to heat (hereinafter referred to as "thermal shock") may be excessively applied to the electronic components. This may result in inadequate protection of the electronic components.

Therefore, the present invention provides a driver which is capable of protecting electronic components from thermal shock.

Means to Solve Problems

In order to solve the above problems, the driver of the present invention includes a substrate to which an electronic component is joined and a resin member that covers the electronic components. The resin member has a first resin portion that covers the electronic components and a second resin portion that covers the first resin portion, and a hardness of the first resin portion is lower than a hardness of the second resin portion.

In the above configuration, the driver may include a housing having a storage portion which takes a frame body as a side wall and the substrate arranged inside an inner peripheral surface of the frame body as a bottom wall, and the first resin portion and the second resin portion may be filled in the storage portion.

In the above configuration, a side surface of the substrate may be coated with an adhesive, which is insulating.

In the above configuration, the frame body may have a receiving portion which projects inward from the inner peripheral surface and on which the substrate is arranged, and a groove portion which is arranged on the receiving portion along the inner peripheral surface and on which the adhesive is arranged.

In the above configuration, the receiving portion may have a first rib that is in contact with the substrate.

In the above configuration, an end surface of the frame body on the substrate side may project further outward than an outer surface of the substrate exposed to an outside of the housing.

In the above configuration, a step portion may be arranged between the end surface of the frame body and the inner peripheral surface of the frame body.

In the above configuration, the receiving portion may have a recess portion penetrating in a substrate thickness direction of the substrate.

In the above configuration, the frame body may have a different-shape portion, the substrate may be arranged inside the frame body in a first state, and the different-shape portion may interfere with the substrate when an attempt is made to arrange the substrate inside the frame body in a second state different from the first state.

In the above configuration, the frame body may have a second rib on the inner peripheral surface, the substrate may have a notch portion in which the second rib is arranged, and the second rib may interfere with the substrate when an attempt is made to arrange the substrate inside the frame body in the second state.

In the above configuration, a wire used for wire bonding and covered with the first resin portion may be provided as the electronic component on the substrate.

Effect

According to the present invention, a driver capable of protecting electronic components from thermal shock can be provided.

DESCRIPTION OF THE EMBODIMENTS

A driver 1 according to an embodiment of the present invention is described with reference to FIGS. 1 to 8.

Figure 1:
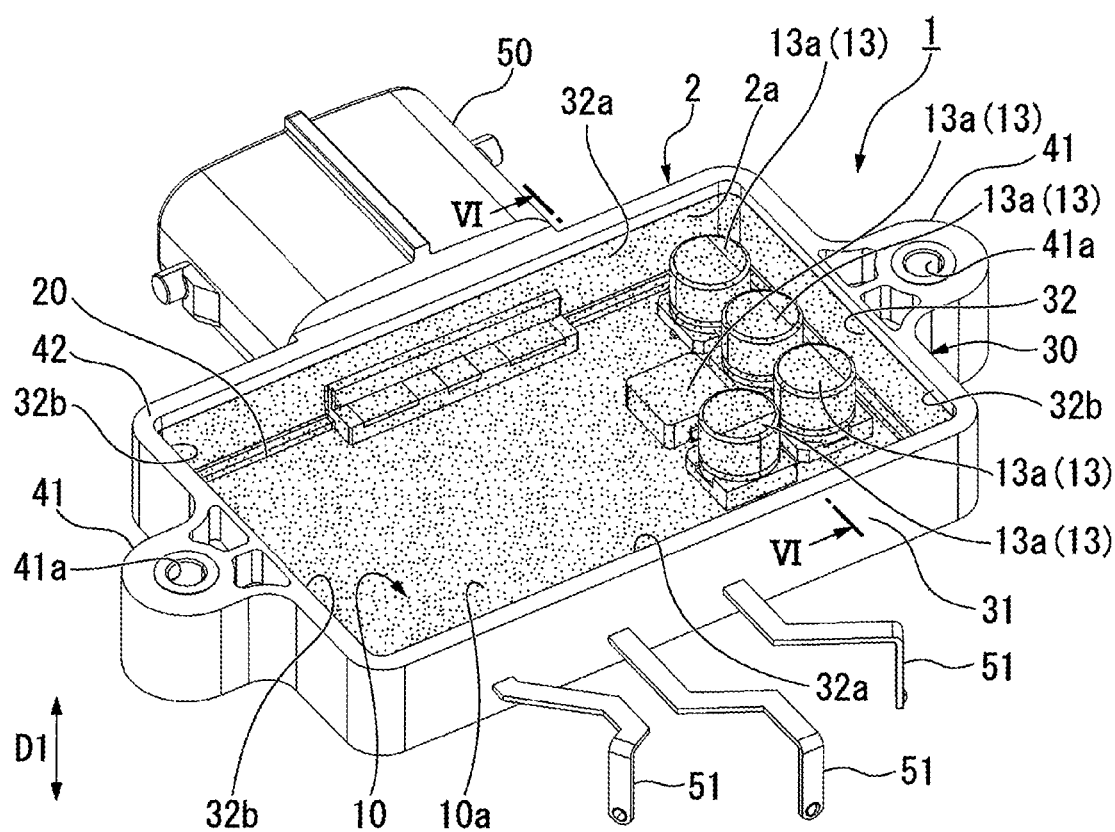
FIG. 1 is a perspective view of a driver according to the present embodiment.

FIG. 1 is a perspective view of the driver 1 according to the present embodiment. The driver 1 is electrically connected to, for example, a motor (not shown) for driving a cooling fan in a vehicle. The driver 1 sends a control signal to the motor to control the motor. The driver 1 is applicable to motors in various applications and other devices. As shown in FIG. 1, the driver 1 has a bathtub-shaped housing 2 having one open side, and a resin member 20 filled inside the housing 2. In FIG. 1, the resin member 20 is perspectively illustrated in order to clarify the internal configuration of the driver 1. The housing 2 has a frame body 30 constituting the side wall of the housing 2, and an aluminum substrate 10 (an example of the "substrate" of the claim) which blocks one of the opening portions of the frame body 30 and is arranged inside an inner peripheral surface 32 of the frame body 30 to constitute the bottom wall of the housing 2.

The inside of the housing 2 is a storage portion 2a. The storage portion 2a of the housing 2 is formed by the inner peripheral surface 32 of the frame body 30 and an inner surface 10a of the aluminum substrate 10.

Figure 2:
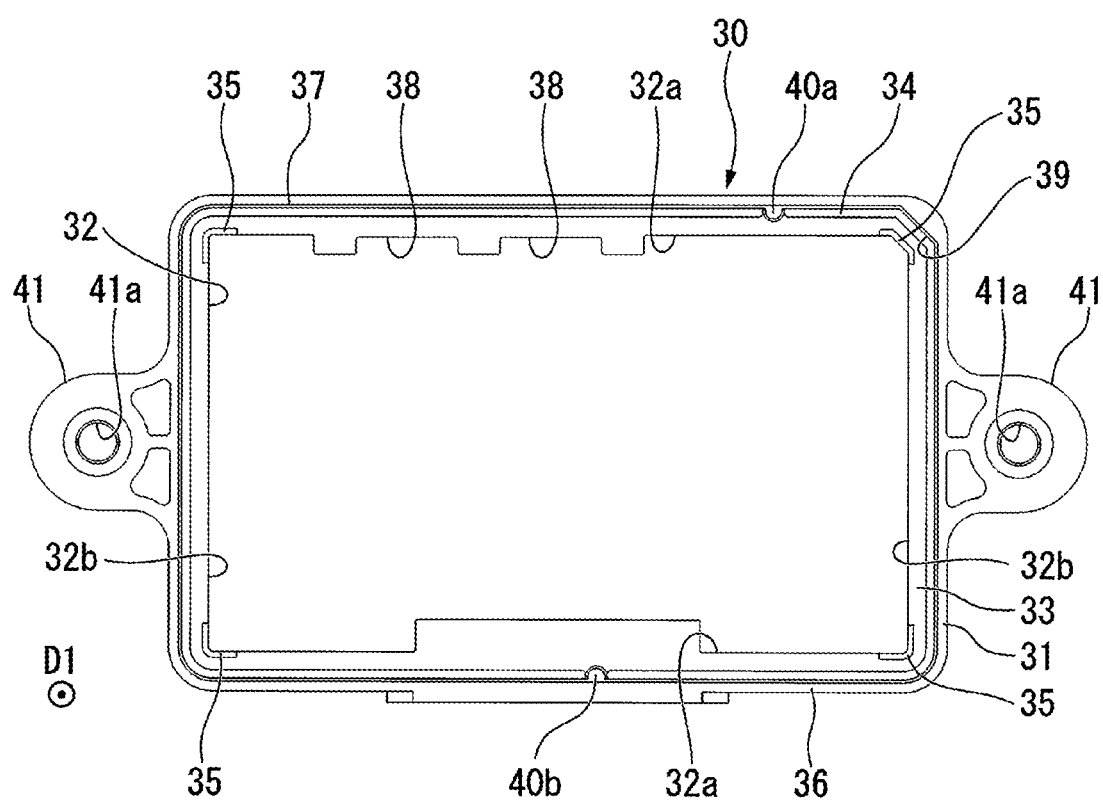
FIG. 2 is a plan view of a frame body according to the present embodiment.

FIG. 2 is a plan view of the frame body 30 according to the present embodiment. FIG. 2 is a plan view of the frame body 30 as viewed from the opening portion on the side where the aluminum substrate 10 is arranged.

Figure 3:
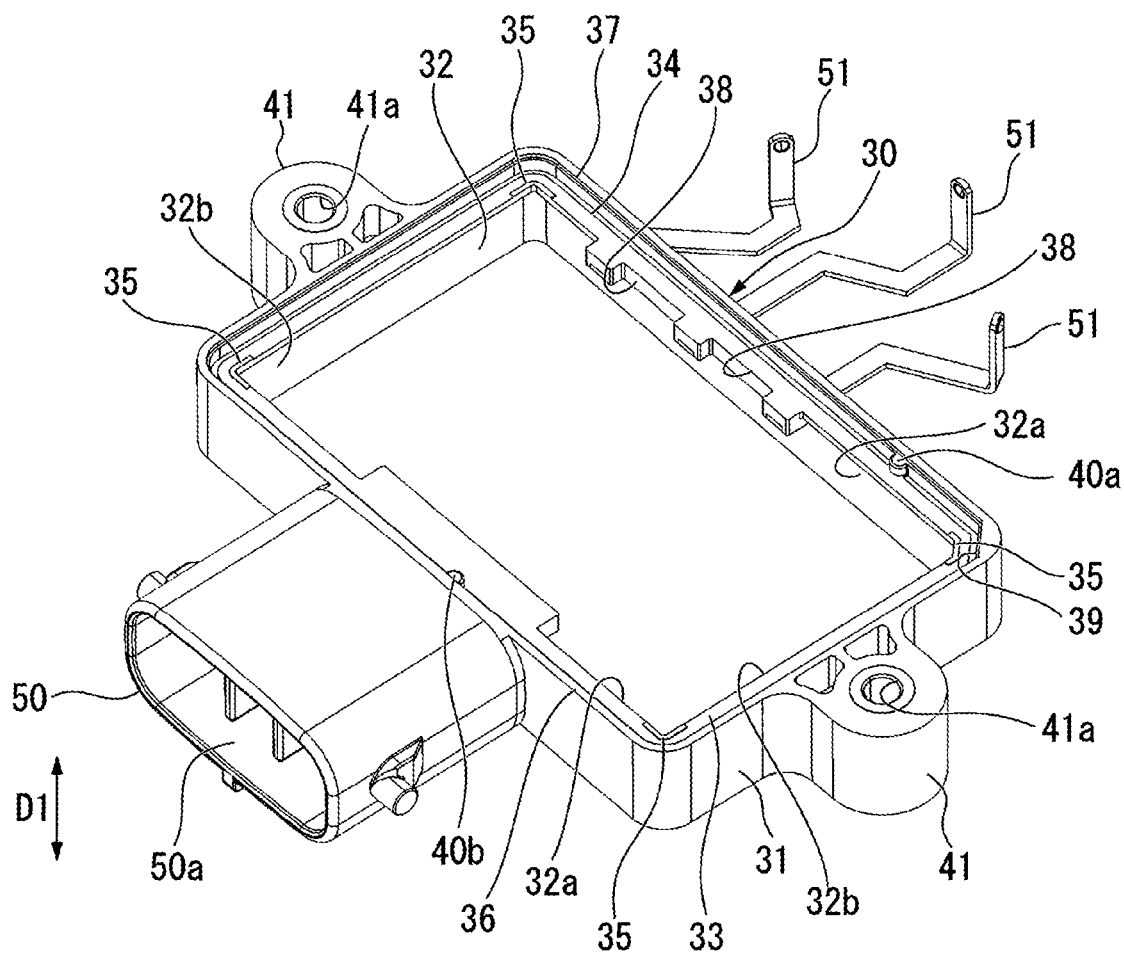
FIG. 3 is a perspective view of the frame body according to the present embodiment.

FIG. 3 is a perspective view of the frame body 30 according to the present embodiment. FIG. 3 is a perspective view of the frame body 30 as viewed from the opening portion on the side where the aluminum substrate 10 is arranged.

Figure 4:
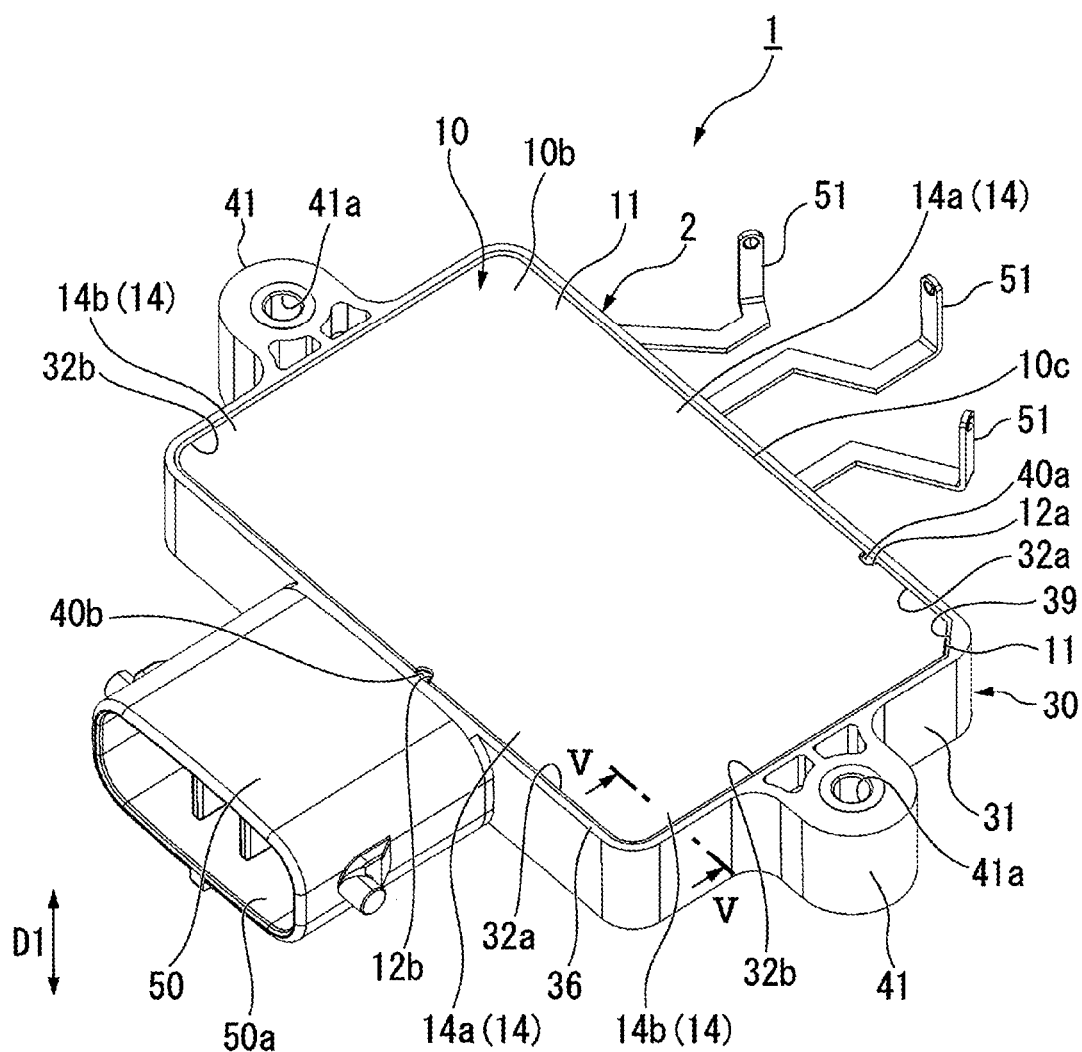
FIG. 4 is a perspective view of the driver according to the present embodiment.

FIG. 4 is a perspective view of the driver 1 according to the present embodiment. FIG. 4 is a perspective view of the driver 1 as viewed from the aluminum substrate 10 side.

Figure 5:
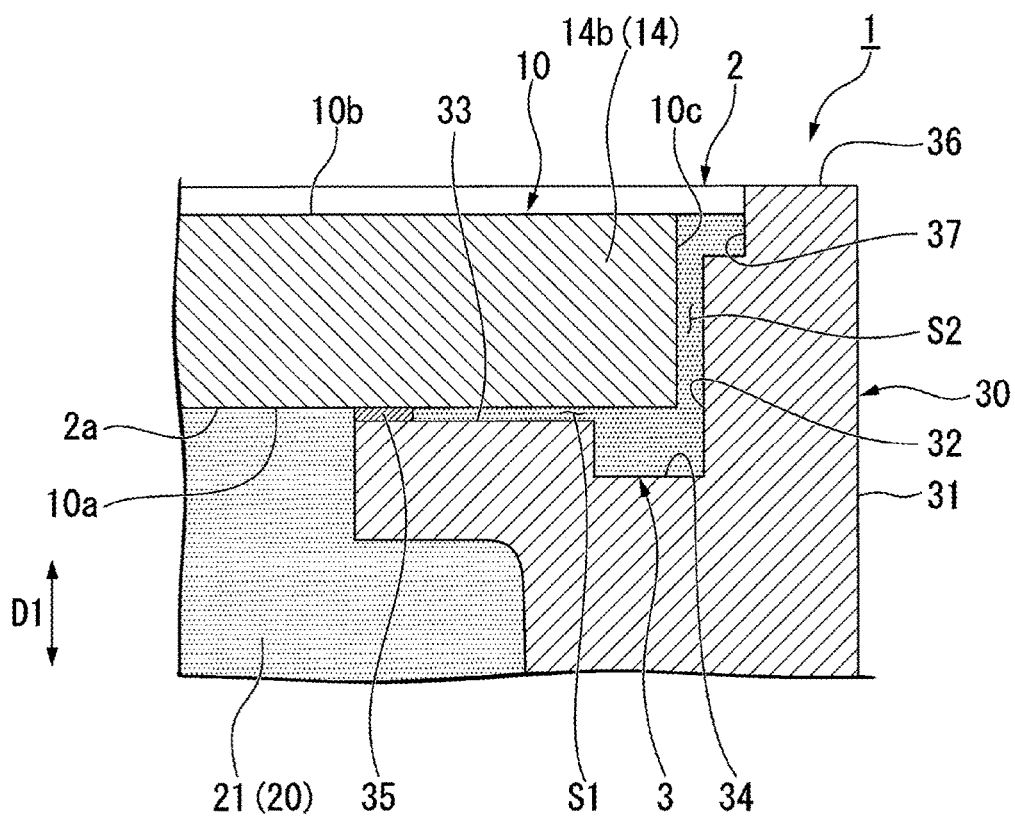
FIG. 5 is a cross-sectional view taken along line V-V of FIG. 4.

FIG. 5 is a cross-sectional view taken along line V-V of FIG. 4. As shown in FIG. 2, the frame body 30 is formed in a rectangular frame shape. As shown in FIG. 3, the inner peripheral surface 32 of the frame body 30 has a pair of long surfaces 32a and a pair of short surfaces 32b.

A pair of mounting portions 41 projecting toward two outer sides is arranged on outer peripheral surfaces 31 of the frame body 30 corresponding to the pair of short surfaces 32b.

A connector 50 electrically connected to electronic components 13 is arranged on one of the outer peripheral surfaces 31 corresponding to the pair of long surfaces 32a. Three terminals 51 are arranged on the other of the outer peripheral surfaces 31 corresponding to the pair of long surfaces 32a.

The mounting portion 41 has a mounting opening portion 41a penetrating the aluminum substrate 10 in a substrate thickness direction D1. The frame body 30 is attached to the vehicle via a mounting screw (not shown) inserted into the mounting opening portion 41a.

The connector 50 is arranged at the center of the outer peripheral surface 31 corresponding to the long surface 32a. The connector 50 has, for example, a fitting portion 50a into which a harness (not shown) is fitted from the outside. The fitting portion 50a is opened in the normal direction of the long surface 32a.

The three terminals 51 are arranged at substantially the same position in the substrate thickness direction D1. Each of the three terminals 51 extends outward from the outer peripheral surface 31. The three terminals 51 are arranged at intervals in the longitudinal direction of the long surface 32a.

The frame body 30 has a receiving portion 33 that projects inward from the inner peripheral surface 32, a groove portion 34 (see FIG. 5) arranged on the receiving portion 33, an end surface 36 being the bottom side of the housing 2, a step portion 37 (see FIG. 5) formed between the inner peripheral surface 32 and the end surface 36, a different-shape portion 39 arranged at one corner, and two second ribs 40a and 40b formed on the inner peripheral surface 32 of the frame body 30.

As shown in FIG. 3, the receiving portion 33 is formed over the entire circumference of the inner peripheral surface 32. The receiving portion 33 is formed at a position corresponding to the three terminals 51 in the substrate thickness direction D1. The receiving portion 33 has four first ribs 35 arranged at positions corresponding to the four corners of the frame body 30, and recess portions 38 penetrating in the substrate thickness direction D1.

As shown in FIG. 5, the first rib 35 projects toward the end surface 36 side of the frame body 30. As shown in FIG. 2, among the four first ribs 35, one first rib 35 is formed in a U-shape in the different-shape portion 39 described later when viewed from the substrate thickness direction D1. The remaining three first ribs 35 are formed in an L-shape when viewed from the substrate thickness direction D1. Each of the four first ribs 35 has a substantially uniform height in the substrate thickness direction D1.

The recess portions 38 are arranged between the three terminals 51. The recess portions 38 open toward the inside of the frame body 30 and are formed in a U-shape when viewed from the substrate thickness direction D1.

As shown in FIG. 2, the groove portion 34 is formed over the entire circumference of the inner peripheral surface 32 when viewed from the substrate thickness direction D1. The groove portion 34 is arranged along the inner peripheral surface 32.

As shown in FIG. 5, the outer side surface of the pair of side surfaces constituting the groove portion 34 is formed flush with the inner peripheral surface 32. The groove portion 34 is formed further outside of the first ribs 35. The depth direction of the groove portion 34 coincides with the substrate thickness direction D1.

As shown in FIG. 2, the end surface 36 of the frame body 30 is formed over the entire circumference of the frame body 30 when viewed from the substrate thickness direction D1.

As shown in FIG. 2, the step portion 37 is formed over the entire circumference of the inner peripheral surface 32.

The different-shape portion 39 is formed at one corner of the frame body 30. The different-shape portion 39 is formed by an inclined surface connecting the long surface 32a and the short surface 32b.

The two second ribs 40a and 40b project toward the inside of the frame body 30, respectively. The two second ribs 40a and 40b are formed between the receiving portion 33 and the end surface 36 in the substrate thickness direction D1. The second rib 40a is formed on one long surface 32a having the different-shape portion 39 at a corner portion. The second rib 40a is formed closer to the different-shape portion 39 side than the intermediate portion in the longitudinal direction on the long surface 32a. The second rib 40b is formed in the intermediate portion in the longitudinal direction on the other long surface 32a.

As shown in FIG. 1, the aluminum substrate 10 is arranged inside the inner peripheral surface 32 of the frame body 30. In the following text, the state of the aluminum substrate 10 arranged inside the frame body 30 is referred to as a first state. More specifically, the aluminum substrate 10 is arranged on the receiving portion 33 of the frame body 30.

As shown in FIG. 5, an edge portion 14 of the aluminum substrate 10 is in contact with the first rib 35 on the receiving portion 33. An outer surface 10b of the aluminum substrate 10 exposed to the outside of the housing 2 is arranged closer to the inside than the end surface 36 of the frame body 30. In other words, the end surface 36 of the frame body 30 on the aluminum substrate 10 side projects further outward than the outer surface 10b of the aluminum substrate 10 exposed to the outside of the housing 2.

As shown in FIG. 4, the aluminum substrate 10 is formed in a shape corresponding to the inner shape of the frame body 30 when viewed from the substrate thickness direction D1. The aluminum substrate 10 is formed to be slightly smaller than the inner shape of the frame body 30. The aluminum substrate 10 is formed in a rectangular plate shape. The edge portion 14 of the aluminum substrate 10 has a pair of long edge portions 14a and a pair of short edge portions 14b. An insulating layer (not shown) is formed on the inner surface 10a of the aluminum substrate 10. A copper foil layer (not shown) is formed on the insulating layer. The aluminum substrate 10 has a chamfered portion 11 obtained by chamfering one of the four corner portions, and two notch portions 12a and 12b formed on the edge portion 14.

The chamfered portion 11 is formed at a position corresponding to the different-shape portion 39 of the frame body 30 in the first state. The chamfered portion 11 has a chamfered C-shape corresponding to the different-shape portion 39.

The two notch portions 12a and 12b are formed on the pair of long edge portions 14a, respectively. The two notch portions 12a and 12b penetrate in the substrate thickness direction D1. The notch portion 12a is formed on one long edge portion 14a having the chamfer portion 11 at the end portion. The notch portion 12a is formed on the chamfered portion 11 side. The notch portion 12b is formed in the intermediate portion of the other long edge portion 14a in the longitudinal direction. In the first state, the second ribs 40a and 40b of the frame body 30 are arranged on the notch portions 12a and 12b, respectively.

Figure 6:
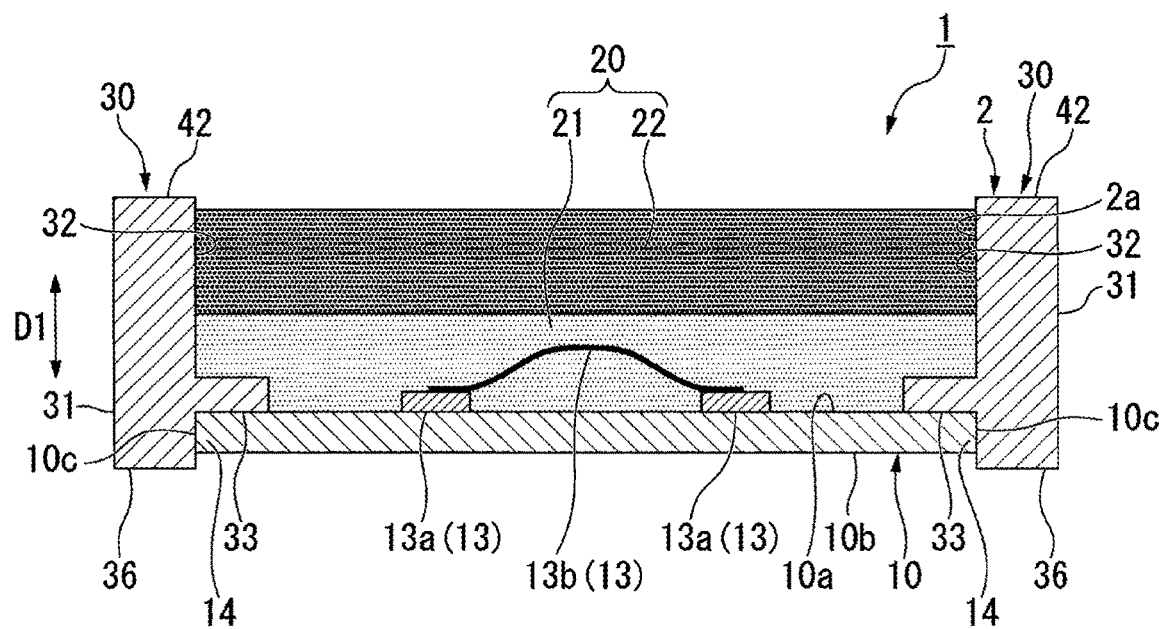
FIG. 6 is a cross-sectional view taken along line VI-VI of FIG. 1.

FIG. 6 is a cross-sectional view taken along line VI-VI of FIG. 1. In FIG. 6, each configuration of the driver 1 is schematically shown.

As shown in FIG. 1, the electronic components 13 are joined to the inner surface 10a of the aluminum substrate 10. The electronic components 13 are electrically connected to the copper foil layer on the inner surface 10a.

As shown in FIG. 6, the electronic components 13 are composed of a plurality of electronic elements 13a, wires 13b for wire bonding the electronic elements 13a to each other, and the like. The electronic elements 13a are joined to the inner surface 10a of the aluminum substrate 10.

In the plurality of electronic elements 13a, an integrated driver unit (IDU) is formed in which driver components (for example, a microcomputer, a control integrated circuit (IC), a field effect transistor (FET), a capacitor, a choke coil, and the like) are integrated into one package.

The resin member 20 is filled in the storage portion 2a of the housing 2 which takes the frame body 30 as the side wall and the aluminum substrate 10 as the bottom wall. The resin member 20 covers the electronic components 13. The resin member 20 has a first resin portion 21 that covers the electronic components 13 and a second resin portion 22 that covers the first resin portion 21.

The hardness (for example, the hardness measured by a durometer) of the first resin portion 21 is lower than the hardness of the second resin portion 22. The resin used as the first resin portion 21 is, for example, gel-like silicone. The resin used as the second resin portion 22 is, for example, an epoxy resin.

(Manufacturing Step)

Subsequently, the manufacturing steps of the driver 1 are described. The manufacturing steps include an arrangement step in which the aluminum substrate 10 is arranged inside the inner peripheral surface 32 of the frame body 30 to form the housing 2, and a filling step in which the resin member 20 is filled into the storage portion 2a of the housing 2.

(Arrangement Step)

The arrangement step is described with reference to FIG. 5.

First, an insulating adhesive 3 is arranged in the groove portion 34. The adhesive 3 is, for example, a thermosetting resin. The adhesive 3 has viscosity for example. The adhesive 3 having viscosity is arranged so as to protrude from the groove portion 34 in the substrate thickness direction D1.

Next, the aluminum substrate 10 is arranged inside the frame body 30 in the first state. That is, the aluminum substrate 10 is arranged inside the frame body 30 so that the chamfered portion 11 is arranged in the different-shape portion 39 and the second ribs 40a and 40b are arranged in the notch portions 12a and 12b, respectively. The inner surface 10a of the aluminum substrate 10 to which the electronic components 13 are joined is pressed toward the frame body 30 side, and the edge portion 14 of the aluminum substrate 10 is pressed against the receiving portion 33 of the frame body 30. The edge portion 14 of the aluminum substrate 10 is in contact with the first rib 35. The adhesive 3 arranged in the groove portion 34 flows by being pressed against the aluminum substrate 10.

The flowing adhesive 3 flows into a space S1 which is formed between the inner surface 10a of the aluminum substrate 10 and the receiving portion 33 of the frame body 30 and a space S2 which is formed between a side surface 10c of the aluminum substrate 10 and the inner peripheral surface 32 of the frame body 30. The adhesive 3 is filled in the space S1 and the space S2. The adhesive 3 flows into the step portion 37 when it reaches the vicinity of the outer surface 10b of the aluminum substrate 10. When the adhesive 3 is cured, the aluminum substrate 10 is fixed to the frame body 30. At this time, the entire surface of the side surface 10c of the aluminum substrate 10 is covered with the insulating adhesive 3.

The aluminum substrate 10 is arranged inside the inner peripheral surface 32 of the frame body 30 by the above step. The housing 2 is formed by fixing the aluminum substrate 10 to the frame body 30 with the adhesive 3.

Here, the frame body 30 and the aluminum substrate 10 interfere with each other when an attempt is made to arrange the aluminum substrate 10 in the second state in which the aluminum substrate 10 is rotated 180 degrees from the first state with the axis passing through the center point of the aluminum substrate 10 and parallel to the substrate thickness direction D1 as the central axis. More specifically, the different-shape portion 39 of the frame body 30 interferes with corner portions other than the chamfered portion 11 of the aluminum substrate 10. In addition, the second ribs 40a and 40b of the frame body 30 interfere with the long edge portions 14a of the aluminum substrate 10. Therefore, the aluminum substrate 10 can be prevented from being arranged inside the frame body 30 in the second state. Thus, incorrect assembly of the aluminum substrate 10 and the frame body 30 can be avoided.

(Filling Step)

The filling step is described with reference to FIGS. 6 to 8.

Figure 7:
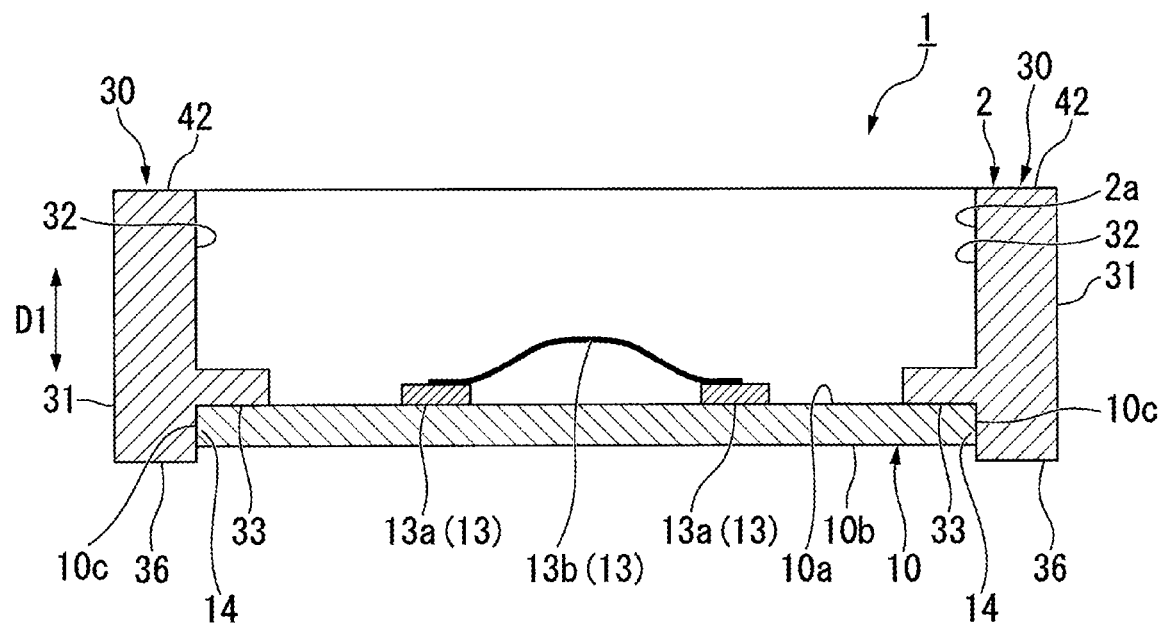
FIG. 7 is a cross-sectional view taken along line VI-VI of FIG. 1 and an explanatory diagram before a first resin portion and a second resin portion are filled.

FIG. 7 is a cross-sectional view taken along line VI-VI of FIG. 1 and an explanatory view before the first resin portion 21 and the second resin portion 22 are filled.

Figure 8:
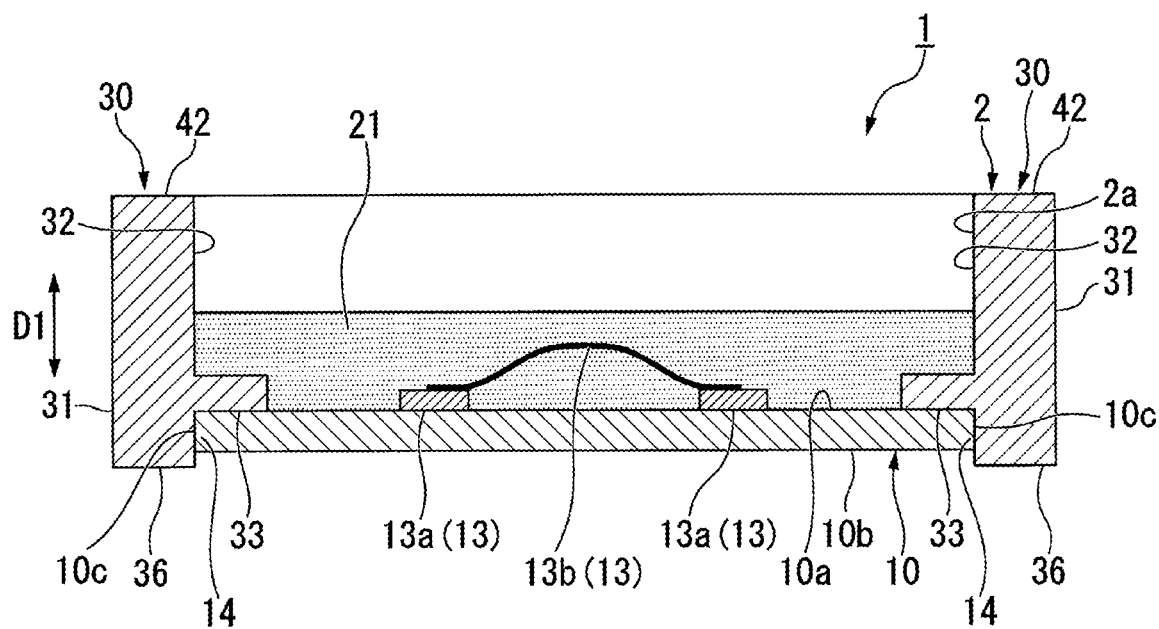
FIG. 8 is a cross-sectional view taken along line VI-VI of FIG. 1 and an explanatory diagram before the second resin portion is filled.

FIG. 8 is a cross-sectional view taken along line VI-VI of FIG. 1 and an explanatory view before the second resin portion 22 is filled.

In FIG. 7 and FIG. 8, each configuration of the driver 1 is schematically shown as in FIG. 6.

First, the storage portion 2a of the housing 2 of FIG. 7 is filled with the first resin portion 21 as shown in FIG. 8. The first resin portion 21 covers the entire outer surface of the electronic elements 13a. The first resin portion 21 covers the entire outer surface of the wires 13b that wire-bond the plurality of electronic elements 13a to each other. Then, the first resin portion 21 is solidified.

Next, as shown in FIG. 6, the second resin portion 22 is filled in the storage portion 2a of the housing 2 so as to cover the first resin portion 21. The second resin portion 22 is filled further inward of the housing 2 than an end surface 42 on the side opposite to the end surface 36 on the aluminum substrate 10 side. The manufacturing step of the driver 1 is completed when the second resin portion 22 is cured.

As described above, in the present embodiment, the driver 1 includes the aluminum substrate 10 to which the electronic components 13 are joined, and the resin member 20 that covers the electronic components 13. The resin member 20 has the first resin portion 21 that covers the electronic components 13 and the second resin portion 22 that covers the first resin portion 21. The hardness of the first resin portion 21 is lower than the hardness of the second resin portion 22.

Accordingly, the thermal shock applied to the electronic components 13 can be mitigated as compared with a case in which the electronic components 13 are covered with the second resin portion 22. Therefore, the electronic components 13 can be protected from thermal shock.

In addition, because the first resin portion 21 is covered with the second resin portion 22 having a hardness higher than that of the first resin portion 21, the strength against an impact from the outside of the housing 2 can be maintained.

The driver 1 includes the housing 2 having the storage portion 2a which takes the frame body 30 as the side wall and the aluminum substrate 10 arranged inside the inner peripheral surface 32 of the frame body 30 as the bottom wall. The first resin portion 21 and the second resin portion 22 are filled in the storage portion 2a.

Accordingly, the aluminum substrate 10 is exposed to the outside of the housing 2. Therefore, the heat generated in the aluminum substrate 10 can be efficiently dissipated to the outside of the housing 2.

The side surface 10c of the aluminum substrate 10 is coated with the insulating adhesive 3.

Accordingly, the insulating property of the side surface 10c of the aluminum substrate 10 can be improved. Therefore, the electronic components 13 housed inside the driver 1 can be protected from, for example, static electricity generated when the driver 1 is assembled.

The frame body 30 has the receiving portion 33 which projects inward from the inner peripheral surface 32 and on which the aluminum substrate 10 is arranged, and the groove portion 34 which is arranged on the receiving portion 33 along the inner peripheral surface 32 and on which the adhesive 3 is arranged.

Accordingly, a sufficient amount of the adhesive 3 for assembling the aluminum substrate 10 to the frame body 30 can be held in the receiving portion 33. Therefore, the aluminum substrate 10 can be assembled to the frame body 30 by a simple step of pressing the aluminum substrate 10 against the receiving portion 33.

In addition, for example, when the adhesive 3 has viscosity, the adhesive 3 projects from the groove portion 34 in the substrate thickness direction D1 when it is arranged in the groove portion 34. Accordingly, the aluminum substrate 10 can be more firmly fixed to the frame body 30 by merely pressing the aluminum substrate 10 against the receiving portion 33. Furthermore, the adhesive 3 flows along the edge portion 14 of the aluminum substrate 10 due to the simple step of pressing the aluminum substrate 10 against the receiving portion 33. Accordingly, the insulating property of the edge portion 14 can be enhanced by simply covering the edge portion 14 with the adhesive 3. Therefore, the electronic components 13 housed inside the driver 1 can be protected from static electricity by a simple step.

The receiving portion 33 has the first ribs 35 in contact with the aluminum substrate 10.

Accordingly, the aluminum substrate 10 can be brought into contact with the first ribs 35 even if the aluminum substrate 10 is pressed against the receiving portion 33 with the adhesive 3 interposed between the aluminum substrate 10 and the receiving portion 33. Therefore, the aluminum substrate 10 can be precisely positioned with respect to the frame body 30.

In addition, the space S1 is formed between the aluminum substrate 10 and the first ribs 35 by bringing the aluminum substrate 10 into contact with the first ribs 35. Accordingly, a sufficient amount of the adhesive 3 can be held between the aluminum substrate 10 and the receiving portion 33 to adhere the aluminum substrate 10 and the receiving portion 33.

The end surface 36 on the aluminum substrate 10 side of the frame body 30 projects further outward than the outer surface 10b of the aluminum substrate 10 exposed to the outside of the housing 2.

Accordingly, the adhesive 3 arranged in the groove portion 34 flows to the vicinity of the outer surface 10b of the aluminum substrate 10 along the inner peripheral surface 32 of the frame body 30 by merely bringing the aluminum substrate 10 into contact with the receiving portion 33. Therefore, the entire surface of the edge portion 14 of the aluminum substrate 10 can be covered. Thus, the insulating property of the side surface 10c of the aluminum substrate 10 can be improved more reliably. Accordingly, the electronic components 13 housed inside the driver 1 can be more reliably protected from static electricity.

The step portion 37 is arranged between the end surface 36 of the frame body 30 and the inner peripheral surface 32 of the frame body 30.

Accordingly, when the aluminum substrate 10 is arranged inside the frame body 30, the adhesive 3 flowing along the inner peripheral surface 32 of the frame body 30 flows into the step portion 37. Therefore, the step portion 37 can stem the adhesive 3 that attempts to flow onto the end surface 36. Thus, the adhesive 3 can be prevented from adhering to the end surface 36, and the outer shape precision of the driver 1 can be maintained.

The receiving portion 33 has the recess portion 38 penetrating in the substrate thickness direction D1 of the aluminum substrate 10.

Accordingly, the receiving portion 33 can be hollowed out. Therefore, the weight of the driver 1 can be reduced.

The frame body 30 has the different-shape portion 39. The aluminum substrate 10 is arranged inside the frame body 30 in the first state. The different-shape portion 39 interferes with the aluminum substrate 10 when an attempt is made to arrange the aluminum substrate 10 inside the frame body 30 in the second state different from the first state. More specifically, the different-shape portion 39 interferes with corner portions other than the chamfered portion 11 of the aluminum substrate 10.

Accordingly, the aluminum substrate 10 can be prevented from being arranged inside the frame body 30 in the second state. Therefore, incorrect assembly of the aluminum substrate 10 and the frame body 30 can be avoided.

The frame body 30 has the second ribs 40a and 40b on the inner peripheral surface 32. The aluminum substrate 10 has the notch portions 12a and 12b on which the second ribs 40a and 40b are arranged.

Accordingly, the movement of the aluminum substrate 10 in the surface direction is suppressed. Therefore, rattling that occurs when the aluminum substrate 10 is assembled to the frame body 30 can be suppressed.

Besides, the second ribs 40a and 40b interfere with the aluminum substrate 10 when an attempt is made to arrange the aluminum substrate 10 inside the frame body 30 in the second state. More specifically, the second ribs 40a and 40b interfere with the long edge portions 14a of the aluminum substrate 10.

Accordingly, the aluminum substrate 10 can be prevented more reliably from being arranged inside the frame body 30 in the second state. Therefore, incorrect assembly of the aluminum substrate 10 and the frame body 30 can be avoided more reliably.

On the aluminum substrate 10, the wire 13b used for wire bonding and covered with the first resin portion 21 is provided as the electronic component 13.

Accordingly, the thermal shock applied to the wire 13b can be mitigated as compared with a case in which the wire 13b is covered with the second resin portion 22. Therefore, the wire 13b for wire bonding, which has a particularly low strength among the electronic components 13, can be protected from thermal shock.

Although the preferred embodiment of the present invention has been described above, the present invention is not limited to the present embodiment. Additions, omissions, substitutions, and other modifications of the configurations can be made without departing from the spirit of the present invention. The present invention is not limited by the foregoing description, and is only limited by the scope of the appended claims.

Moreover, in the present embodiment, the aluminum substrate 10 is the bottom wall of the housing 2. However, the aluminum substrate 10 may also be housed inside the housing 2. That is, the entire aluminum substrate 10 may be covered with the first resin portion 21. Moreover, in the present embodiment, the substrate included in the driver 1 is the aluminum substrate 10. However, the substrate included in the driver 1 is not limited to the aluminum substrate 10.

Besides, the components in the above-described embodiment can be replaced with well-known components as appropriate without departing from the spirit of the present invention. In addition, other embodiments may be appropriately combined with the above-described embodiments.

What is claimed is:

1. A driver comprising:
   a substrate to which an electronic component is joined;
   a resin member that covers the electronic component,
   wherein the resin member comprises a first resin portion that covers the electronic component and a second resin portion that covers the first resin portion, and a hardness of the first resin portion is lower than a hardness of the second resin portion; and
   a housing having a storage portion which takes a frame body as a side wall and the substrate arranged inside an inner peripheral surface of the frame body as a bottom wall, and
   the first resin portion and the second resin portion are filled in the storage portion., and
   wherein a side surface of the substrate is coated with an adhesive, which is insulating, and
   wherein the frame body comprises a receiving portion which projects inward from the inner peripheral surface and on which the substrate is arranged, and a groove portion which is arranged on the receiving portion along the inner peripheral surface and on which the adhesive is arranged.

2. The driver according to claim 1, wherein the receiving portion comprises a first rib that is in contact with the substrate.

3. The driver according to claim 2, wherein an end surface of the frame body on the substrate side projects further outward than an outer surface of the substrate exposed to an outside of the housing.

4. The driver according claim 2, wherein the receiving portion has a recess portion that penetrates in a substrate thickness direction of the substrate.

5. The driver according to claim 2, wherein the frame body has a different-shape portion, the substrate is arranged inside the frame body in a first state, and the different-shape portion interferes with the substrate when an attempt is made to arrange the substrate inside the frame body in a second state different from the first state.

6. The driver according to claim 2, wherein a wire used for wire bonding and covered with the first resin portion is provided as the electronic component on the substrate.

7. The driver according to claim 1, wherein an end surface of the frame body on the substrate side projects further outward than an outer surface of the substrate exposed to an outside of the housing.

8. The driver according to claim 7, wherein a step portion is arranged between the end surface of the frame body and the inner peripheral surface of the frame body.

9. The driver according claim 8, wherein the receiving portion has a recess portion that penetrates in a substrate thickness direction of the substrate.

10. The driver according to claim 8, wherein the frame body has a different-shape portion, the substrate is arranged inside the frame body in a first state, and the different-shape portion interferes with the substrate when an attempt is made to arrange the substrate inside the frame body in a second state different from the first state.

11. The driver according claim 7, wherein the receiving portion has a recess portion that penetrates in a substrate thickness direction of the substrate.

12. The driver according to claim 7, wherein the frame body has a different-shape portion, the substrate is arranged inside the frame body in a first state, and the different-shape portion interferes with the substrate when an attempt is made to arrange the substrate inside the frame body in a second state different from the first state.

13. The driver according to claim 1, wherein the receiving portion has a recess portion that penetrates in a substrate thickness direction of the substrate.

14. The driver according to claim 13, wherein the frame body has a different-shape portion, the substrate is arranged inside the frame body in a first state, and the different-shape portion interferes with the substrate when an attempt is made to arrange the substrate inside the frame body in a second state different from the first state.

15. The driver according to claim 1, wherein the frame body has a different-shape portion, the substrate is arranged inside the frame body in a first state, and the different-shape portion interferes with the substrate when an attempt is made to arrange the substrate inside the frame body in a second state different from the first state.

16. The driver according to claim 15, wherein the frame body comprises a second rib on the inner peripheral surface, the substrate has a notch portion in which the second rib is arranged, and the second rib interferes with the substrate when an attempt is made to arrange the substrate inside the frame body in the second state.

17. The driver according to claim 1, wherein a wire used for wire bonding and covered with the first resin portion is provided as the electronic component on the substrate.

* * * * *